(12) United States Patent
Cho et al.

(10) Patent No.: US 6,919,597 B2
(45) Date of Patent: Jul. 19, 2005

(54) BISMUTH TITANIUM SILICON OXIDE, BISMUTH TITANIUM SILICON OXIDE THIN FILM, AND METHOD FOR FORMING THE THIN FILM

(75) Inventors: Young-jin Cho, Incheon (KR); Yo-sep Min, Suwon (KR); Young-soo Park, Suwon (KR); Jung-hyun Lee, Suwon (KR); June-key Lee, Yongin (KR); Yong-kyun Lee, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 49 days.

(21) Appl. No.: 10/634,841

(22) Filed: Aug. 6, 2003

(65) Prior Publication Data

US 2004/0028811 A1 Feb. 12, 2004

(30) Foreign Application Priority Data

Aug. 6, 2002 (KR) .................................. 2002-46306

(51) Int. Cl.$^7$ .................... H01L 29/76; H01L 27/108
(52) U.S. Cl. .................. 257/310; 257/295; 438/3; 428/446; 428/689; 428/702; 501/134
(58) Field of Search ................. 257/295, 310; 438/3; 501/134; 428/446, 689, 702

(56) References Cited

U.S. PATENT DOCUMENTS

| | | | | |
|---|---|---|---|---|
| 6,004,392 A | * | 12/1999 | Isobe et al. | 117/88 |
| 6,126,743 A | * | 10/2000 | Saegusa et al. | 117/68 |
| 6,440,591 B1 | * | 8/2002 | Matsunaga et al. | 428/699 |
| 2003/0227803 A1 | * | 12/2003 | Natori et al. | 365/200 |
| 2004/0136891 A1 | * | 7/2004 | Kijima et al. | 423/263 |
| 2004/0211998 A1 | * | 10/2004 | Araujo et al. | 257/295 |

FOREIGN PATENT DOCUMENTS

| EP | 0 953 550 A1 | 11/1999 | |
|---|---|---|---|
| EP | 1 045 435 A2 A3 | 10/2000 | |
| JP | 11186523 A | * 7/1999 | ......... H01L/21/108 |

OTHER PUBLICATIONS

XP-002254335—Derwent Abstract—"Dielectric, glass-ceramic materials—contg. calcium bismuth . . . ".
XP-002260231—Derwent Abstract—JP 52 060989 (May 19, 1977).

* cited by examiner

*Primary Examiner*—George Eckert
(74) *Attorney, Agent, or Firm*—Lee & Morse, P.C.

(57) ABSTRACT

A bismuth titanium silicon oxide having a pyrochlore phase, a thin film formed of the bismuth titanium silicon oxide, a method for forming the bismuth-titanium-silicon oxide thin film, a capacitor and a transistor for a semiconductor device including the bismuth-titanium-silicon oxide thin film, and an electronic device employing the capacitor and/or the transistor are provided. The bismuth titanium silicon oxide has good dielectric properties and is thermally and chemically stable. The bismuth-titanium-silicon oxide thin film can be effectively used as a dielectric film of a capacitor or as a gate dielectric film of a transistor in a semiconductor device. Various electronic devices having good electrical properties can be manufactured using the capacitor and/or the transistor having the bismuth-titanium-silicon oxide film.

6 Claims, 12 Drawing Sheets

BISMUTH TITANIUM SILICON OXIDE, BISMUTH TITANIUM SILICON OXIDE THIN FILM, AND METHOD FOR FORMING THE THIN FILM

BACKGROUND OF THE INVENTION

1. Field of the Invention

The present invention relates to a titanium silicon oxide, a titanium silicon oxide thin film, and a method for forming the titanium silicon oxide thin film. More particularly, the present invention is directed to a novel bismuth titanium silicon oxide, a thin film formed of the bismuth titanium silicon oxide, a method for forming the bismuth-titanium-silicon oxide thin film, a capacitor and a transistor using the bismuth-titanium-silicon oxide thin film, and an electronic device having the capacitor and/or the transistor. The novel bismuth titanium silicon oxide exhibits good dielectric properties that enables it to be used in a capacitor and a transistor in highly integrated memory devices.

2. Description of the Related Art

As the integration density of memory devices become greater, unit cell size and capacitor area become smaller. Accordingly, there have been many attempts to use a high dielectric constant material in order to form a high capacitance capacitor in a limited area. As a result, high dielectric constant materials, such as tantalum oxide (TaO), barium titanium oxide ($BaTiO_3$), strontium titanium oxide ($SrTiO_3$), have attracted more attention than conventional low dielectric constant materials such as $SiO_2$ and $Si_3N_4$.

Although these high dielectric constant materials are available, it is necessary to manufacture 3-dimentional capacitors with these materials using, for example, metal organic chemical vapor deposition (MOCVD) or atomic layer deposition (ALD) methods. However, these methods cause problems when applied to form such high dielectric thin films.

In order to make these precursors easily vaporizable, high temperatures are necessary to supply and vaporize the same. However, high temperatures shorten the lifespan of parts of film formation systems and equipment. Moreover, when a multi-component film is formed using these high dielectric materials, different kinds of precursors mixed in a single cocktail solution interact with one another so that the stability of the precursor solution degrades during storage.

SUMMARY OF THE INVENTION

According to a feature of an embodiment of the present invention, there is provided a bismuth titanium silicon oxide, as a novel high dielectric constant material.

According to another feature of an embodiment of the present invention, there is provided a thin film formed of the above bismuth titanium silicon oxide and a simple and easily reproducible method for forming the bismuth-titanium-silicon oxide thin film.

According to yet another feature of an embodiment of the present invention, there is provided a capacitor and a transistor for semiconductor devices with good electrical properties, which include the bismuth-titanium-silicon oxide thin film, and an electronic device employing the capacitor and/or the transistor.

According to still another feature of an embodiment of the present invention, there is provided a bismuth titanium silicon oxide of formula (1) below having a pyrochlore phase:

$$Bi_2(Ti_{2-x}Si_x)O_{7-y} \quad (1)$$

where x is a figure ranging from 0.8 to 1.3, and y is a figure ranging from −1 to 1.

According to still another feature of an embodiment of the present invention, there is provided a bismuth-titanium-silicon oxide thin film of formula (1) above having a pyrochlore phase.

According to a feature of an embodiment of the present invention, there is provided a method for forming a bismuth-titanium-silicon oxide thin film of formula (1) above having a pyrochlore phase, the method including (a1) supplying a precursor mixture containing a bismuth precursor, a titanium precursor, and a silicon precursor into a vaporizer in a non-oxidative atmosphere to adsorb the precursor mixture onto a surface of a substrate, and (b1) oxidizing the precursor mixture adsorbed onto the surface of the substrate to deposit atomic layers of the precursor mixture on the surface of the substrate.

According to another feature of an embodiment of the present invention, there is provided a method for forming a bismuth-titanium-silicon oxide thin film of formula (1) above having a pyrochlore phase, including (a2) creating an oxidative atmosphere in a reactor, and (b2) supplying a precursor mixture containing a bismuth precursor, a titanium precursor, and a silicon precursor into the reactor and depositing the precursor mixture on a surface of a substrate by vapor deposition.

According to another feature of an embodiment of the present invention, there is provided a capacitor for a semiconductor device, the capacitor including a lower electrode, a dielectric film formed on the lower electrode of a bismuth titanium silicon oxide of formula (1) above having a pyrochlore phase, and an upper electrode formed on the dielectric film.

According to another feature of an embodiment of the present invention, there is provided a transistor for a semiconductor device, the transistor having a source electrode, a drain electrode, a substrate having a conductive region between the source electrode and the drain electrode, a gate dielectric film formed on the conductive region of a bismuth titanium silicon oxide of formula (1) above having a pyrochlore phase, and a gate electrode formed on the gate dielectric film.

According to another feature of an embodiment of the present invention, there is provided an electronic device comprising a capacitor and/or a transistor, wherein the capacitor includes a lower electrode, a dielectric film formed on the lower electrode of a bismuth titanium silicon oxide of formula (1) above having a pyrochlore phase, and an upper electrode formed on the dielectric film, and the transistor includes a source electrode, a drain electrode, a substrate having a conductive region between the source electrode and the drain electrode, a gate dielectric film formed on the conductive region of a bismuth titanium silicon oxide of formula (1) above having a pyrochlore phase, and a gate electrode formed on the gate dielectric film.

According to another feature of an embodiment of the present invention, the electronic device according to the present invention may be a dynamic random access memory.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-46306, filed on Aug. 6, 2002, and entitled: "BISMUTH TITANIUM SILICON OXIDE, BISMUTH TITANIUM SILICON OXIDE THIN FILM, AND METHOD FOR FORMING THE THIN FILM," is incorporated by reference herein in its entirety.

The present invention provides a high dielectric constant material of formula (1) below having a pyrochlore phase:

$$Bi_2(Ti_{2-x}Si_x)O_{7-y} \quad (1)$$

where x is a figure ranging from 0.8 to 1.3, and y is a figure ranging from −1 to 1.

The pyrochlore phase of the bismuth titanium silicon oxide (hereinafter, also simply referred as "Bi—Ti—Si—O") of formula (1) above is confirmed by the following experimental data.

Figure 5:
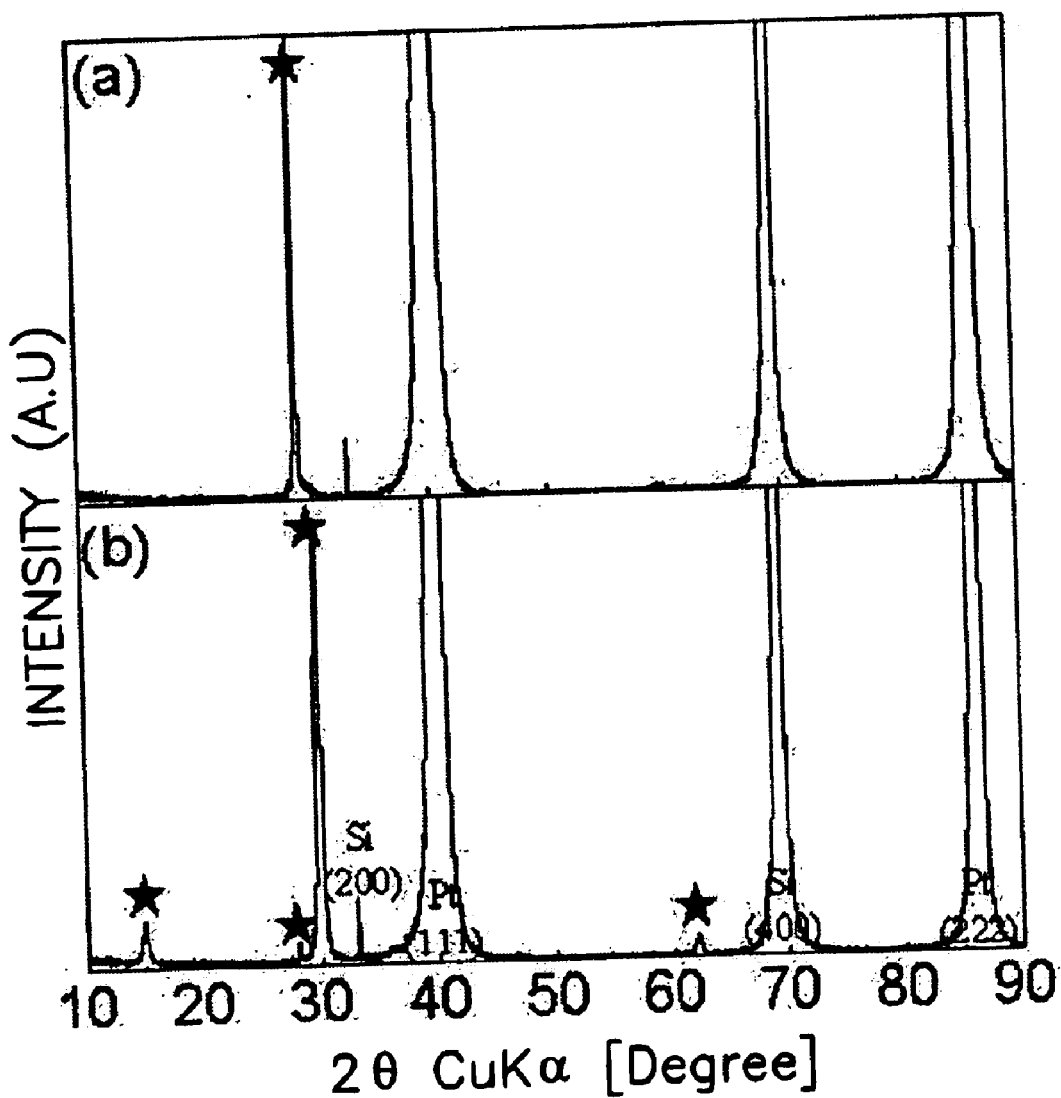
FIG. 5 illustrates a graph showing the result of an X-ray diffraction analysis performed on a Bi—Ti—Si—O thin film before and after annealing in a capacitor manufactured in Example 7 according to the present invention.
Figure 11A:
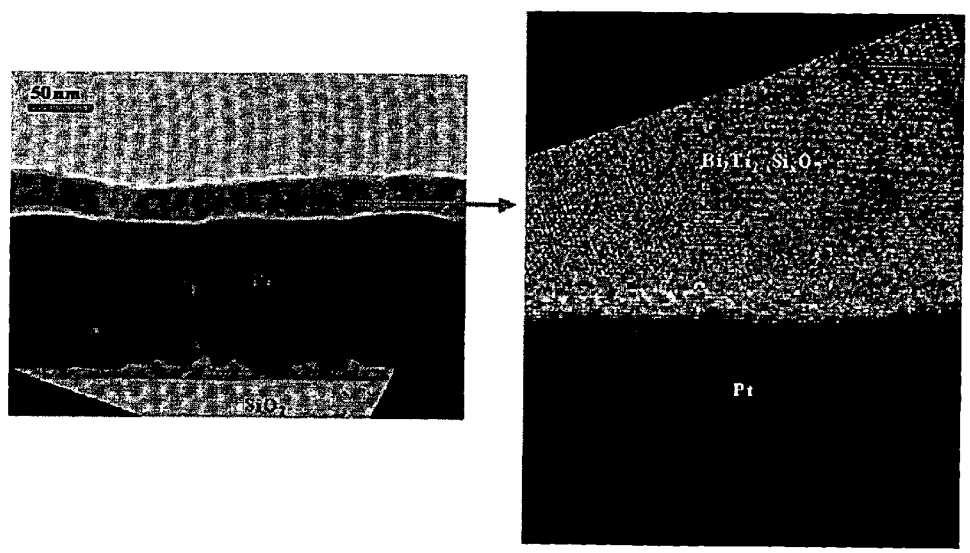
FIG. 11A is a transmission electron microscopic (TEM) photographs, after annealing, of a Bi—Ti—Si—O thin film manufactured in Example 7.
Figure 11B:
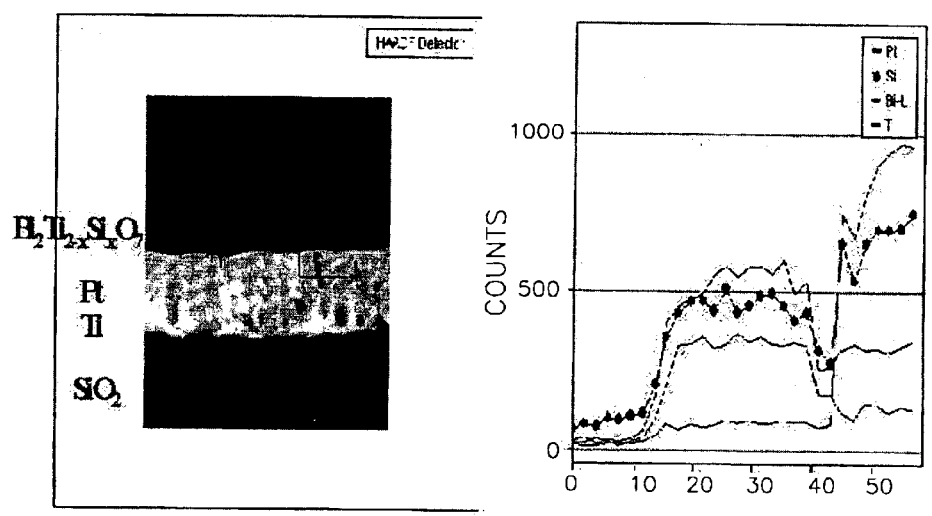
FIG. 11B illustrates a graph of the composition of the thin film analyzed using STEM-EDX (Scanning Transmission Electron Microscope-Energy Dispersive Spectrometer)

The X-ray diffraction pattern of FIG. 5 for the Bi—Ti—Si—O according to the present invention is similar to that of $Bi_2Ti_2O_7$ shown in JCPDS card 32-0118, J. Cryst. Growth, 41, 317 (1997), and the high-resolution transmission electron microscopic (HRTEM) photograph of FIG. 11B confirms a uniform crystal lattice configuration in the Bi—Ti—Si—O according to the present invention. As illustrated in FIG. 11A, which shows the result of a compositional analysis on a single grain along the thickness direction of the thin film, the composition distribution of Bi, Ti, and Si is uniform throughout the thickness of the thin film.

Figure 12:
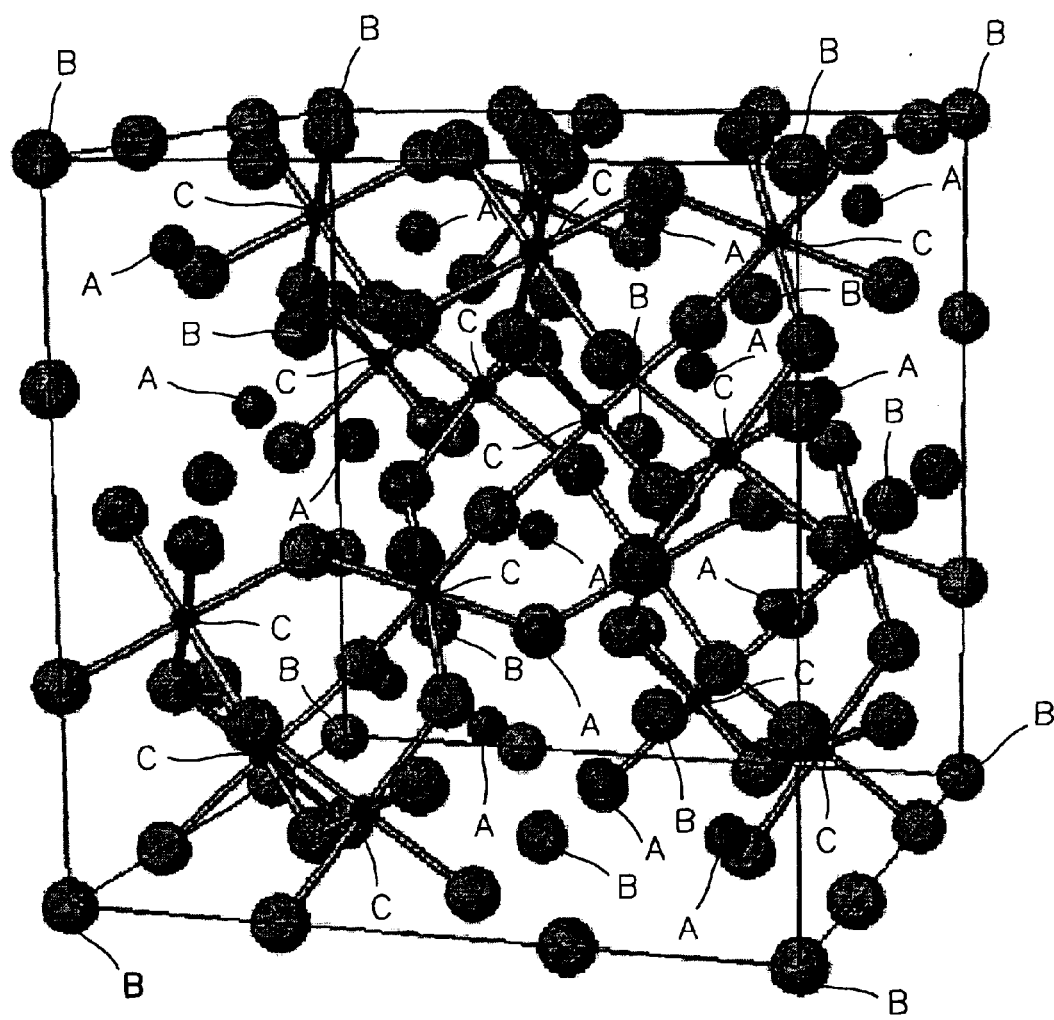
FIG. 12 illustrates a lattice structure of $A_2B_2X_7$ or $A_2B_2X_6Z$ that is similar to the crystalline structure of the Bi—Ti—Si—O thin film formed in Example 7 according to the present invention.

Pyrochlore phases refer to cubic lattice systems expressed as $A_2B_2X_7$ or $A_2B_2X_6Z$, where A and B are cations, and X and Z are anions. In an example, $(BX_6)n^-$ faces are linked to one another only by spheres, and the A cations are present in the interstices, as shown in FIG. 12, which is disclosed in J. Appl. Phys., Vol. 51, No. 1 (1980). In FIG. 12, spheres (A) indicate A cations, spheres (C) indicate B cations, and spheres (C) and the remaining spheres indicate X and Y anions, respectively.

A thin film may be formed from the Bi—Ti—SI—O of formula (1) above using general thin film formation methods, for example, metal organic chemical vapor deposition (MOCVD), atomic layer deposition (ALD), pulsed laser deposition (PLD), molecular beam epitaxy (MBE), etc. These methods are described in detail below.

First, a Bi—Ti—Si—O thin film is formed as follows using ALD. After a substrate on which a thin film is to be formed is heated, the heated substrate is transferred into a heater to stabilize the temperature of the substrate within a predetermined range of temperatures, preferably, a range of 150–700° C., and more preferably, a range of 250–500° C. If the substrate temperature is less than 150° C., a high-density thin film cannot be formed, and the unreacted precursor or impurities such as carbon or chlorine remain in the thin film, leading to a poor film characteristics such as crystallinity. If the substrate temperature is above 700° C., the precursor undergoes serious chemical changes due to the heat so that it cannot be vaporized sufficiently during a purging process following adsorption onto the surface of the substrate. As a result, the resulting thin film has a rough surface, and impurities such as carbon remain in the thin film due to the modified, poorly vaporizable ligand.

Examples of such a substrate include, but are not limited to, a $Ru/SiO_2/Si$ substrate and a $Pt/Ti/SiO_2/Si$ substrate.

Next, a non-oxidative atmosphere is created using inert gas. Suitable examples of inert gas include argon gas, nitrogen gas, etc. It is preferable that this inert gas is supplied at a rate of 100–300 sccm. If the flow rate of the inert gas is less 100 sccm, it takes a longer duration to purge oxidative gas or the remaining unnecessary vaporized precursor from a reactor. If the flow rate of the inert gas exceeds 300 sccm, due to an abrupt change in the pressure of the reactor from the oxidation step or the precursor adsorption step, a stable thin film cannot be formed within the reactor.

Next, a precursor mixture of a Bi—Ti—Si—O thin film is supplied into a vaporizer to vaporize and adsorb it onto the surface of the substrate. It is preferable that the vaporizer's temperature is controlled within a range of 170–300° C., and more particularly, a range of 200–250° C., to sufficiently vaporize the precursor mixture without thermal changes. It is preferable that the precursor mixture of the Bi—Ti—Si—O thin film is supplied at a rate of 0.01–0.3 cc/min. If the vaporizer's temperature is less than 170° C., a sufficient amount of precursor mixture cannot vaporized. If the vaporizer's temperature exceeds 300° C., the precursor mixture is highly likely to thermally change so that a sufficient amount of precursor mixture cannot be vaporized and supplied into the reactor.

Methods for supplying a precursor mixture of a Bi—Ti—Si—O thin film according to the present invention include, but are not limited to, a method using a bubbler, a direct liquid injection (DLI) method, etc. In DLI methods, a precursor of a desired Bi—Ti—Si—O thin film is dissolved in an organic solvent with an appropriate concentration, and the precursor solution is supplied directly into a vaporizer at a temperature near the vaporization temperature of the precursor or the organic solvent and then into a reactor. This DLI method is more preferable than the method using a bubbler. This is because changes of the precursor mixture over time can be effectively suppressed with the DLI method, whereas the precursor mixture of a Bi—Ti—Si—O thin film is exposed to heat for a long time in the method using a bubbler.

The precursor mixture of a Bi—Ti—Si—O thin film according to the present invention is prepared by mixing a Bi precursor, a Ti precursor, and a Si precursor in a solvent. It is preferable that the amount of Ti precursor is in a range of 1–3 moles based on 1 mole of Bi precursor and that the amount of Si precursor is in a range of 0.5–3 moles based on 1 mole of Bi precursor. If the amount of Ti precursor is less than the lower limit, the resulting thin film contains a relatively large amount of Bi with a rough surface. If the amount of Ti precursor exceeds the upper limit, although a thin film with an even surface can be formed, the deposition rate becomes slow, and the electrical properties of the thin film degrade. If the amount of Si precursor is less than the lower limit, the resulting thin film has a rough surface. If the amount of Si precursor exceeds the upper limit, although a thin film with an even surface can be formed, the deposition rate becomes slow, and the electrical properties of the thin film degrade.

Examples of such a Bi precursor include $Bi(MMP)_3$ {Tris (1-methoxy-2-methyl-2-propxy)bismuth}, $Bi(phen)_3$, where "phen" indicates phenyl, $BiCl_3$, and the like. Examples of such a Ti precursor include $Ti(MMP)_4$ {Tetrakis(1-methoxy-2-methyl-2-propoxy)titanium)}, $TiO(tmhd)_2$, where "tmhd" indicates 2,2,6,6-tetramethylheptane-3,5-dionate, $Ti(i-OPr)_2$ $(tmhd)_2$, where "i-OPr" indicates isopropyl, $Ti(dmpd)(tmhd)_2$, where "dmpd" indicates dimethyl pentanediol, $Ti(depd)(tmhd)_2$, where "depd" indicates diethyl pentanediol, $TiCL_4$, and the like. Examples of such a Si precursor include tetraethyl orthosilicate (TEOS), $SiCL_4$, and the like.

Examples of such an organic solvent include any solvent capable of diluting or dissolving a Bi precursor, a Ti precursor, and a Si precursor, and particularly, ethylcyclohexane ($C_8H_{16}$, hereinafter, simply referred to as "ECH"), tetrahydrofuran, n-butyl acetate, butyronitrile, and the like. It is preferable that the amount of organic solvent is determined such that the Bi, Ti, and Si precursors each have a concentration of 0.04–0.2 M.

As described above, after the precursor mixture of the Bi—Ti—Si—O thin film has been adsorbed onto the surface of the substrate, inert gas is supplied to purge away the adsorbed precursor mixture such that only one to three layers of the precursor mixture remain on the surface of the substrate. The flow rate of inert gas may be varied depending on the atomic layer deposition equipment used. However, it is preferable that the flow rate of inert gas is in a range of 100–300 sccm and that the working pressure of the reactor is in a range of 0.5–10 torr. Alternatively, this purging process using inert gas may be omitted if required.

Next, the precursor mixture adsorbed onto the surface of the substrate is oxidized by oxidizing gas to form an atomic oxide layer so that a complete Bi—Ti—Si—O thin film is formed. Examples of oxidizing gas include oxygen ($O_2$), ozone ($O_3$), water vapor ($H_2O$), and the like. Preferably, the oxidizing gas is supplied at a rate of 100–300 sccm.

The above-described inert gas purging, precursor mixture adsorption, inert gas purging, and oxidation processes are repeatedly performed until a Bi—Ti—Si—O thin film of a desired thickness is formed. It is preferable that the resulting Bi—Ti—Si—O thin film has a thickness of 50–300 Å and a dielectric constant of 100–200.

Alternatively, after the desired Bi—Ti—Si—O thin film has been formed, additional high-temperature annealing may be performed to enhance the crystalline properties of the Bi—Ti—Si—O thin film for improved dielectric properties. High-temperature annealing may be performed at a temperature of 500–800° C. for 1–30 minutes.

The working pressure of the reactor is adjusted within a range of 0.01–100 mtorr, and preferably, to about 35 mtorr.

According to a method for forming Bi—Ti—Si—O thin film using MOCVD, initially, an oxidative atmosphere is created in a reactor using, for example, oxidizing gas such as $O_2$, $O_3$, water vapor ($H_2O$), etc. The flow rate of oxidizing gas may be varied depending on the deposition equipment. However, it is preferable that the flow rate of oxidizing gas is in a range of 100–300 sccm.

Next, the temperature of a substrate on which the thin film is to be formed is stabilized within a predetermined range of temperatures. The substrate's temperature means the reactor's temperature. The substrate's temperature is in a range of 300–500° C. If the substrate's temperature exceeds the above range, the same problems as described above in conjunction with the ALD method occur. The same kinds of substrates described above in conjunction with the ALD method may be used.

Next, a precursor mixture of the desired Bi—Ti—Si—O thin film is supplied into the reactor in the oxidative atmosphere to be deposited on the substrate as a thin film. The composition of the precursor mixture of the Bi—Ti—Si—O thin film and a method for supplying the precursor mixture into the reactor are the same or similar to as in the ALD method described above.

In a similar manner to the above-described ALD, after the Bi—Ti—Si—O thin film has been formed, additional high-temperature annealing may be performed under the same conditions as described above, to enhance the crystalline properties of the Bi—Ti—Si—O thin film for improved dielectric properties.

A Bi—Ti—Si—O thin film according to an embodiment of the present invention may be formed using PLD. In this PLD method, as a target precursor is irradiated with strong pulsed laser light, particles are separated from the target precursor, form plasma through subsequent light energy irradiation, and are deposited onto a substrate as a good quality Bi—Ti—Si—O thin film. According to this method, a Bi—Ti—Si—O thin film can be deposited even at a high oxygen partial pressure using simple parts, such as a target precursor, a substrate, a heater, and the like installed in a reaction chamber. Because the kinetic energy of precursor particles reaching the substrate amounts to a few hundreds of eV, an oxide layer can be formed at a relatively low temperature without damaging the previously deposited layers so that a good quality Bi—Ti—Si—O thin film can be manufactured. In an embodiment of Bi—Ti—Si—O thin film formation using PLD, a Bi—Ti—Si—O thin film may be manufactured with a substrate's temperature of 250–600° C., an ArF laser of a wavelength of 198 nm, a laser beam size of about 0.3 $cm^2$, an $O_2$ pressure of 0.1–0.5 torr, and a laser pulse repetition frequency of about 5 Hz.

The growth of oxide can be controlled to an atomic level with MBE methods. When a Bi—Ti—Si—O thin film is formed using MBE, Bi, Ti, and $Si_2H_6$ may be used as precursors, and $O_2$ or $O_3$ may be used as the oxidizing gas.

A capacitor according to the present invention can be manufactured using the Bi—Ti—Si—O thin film formed by any method described above. A capacitor according to the present invention includes the above-described Bi—Ti—Si—O thin film as a dielectric layer between an upper electrode and a lower electrode. Any kinds of materials, for example, platinum (Pt) group elements, may be used for the upper and lower electrodes without limitations. These Pt group elements indicate at least one metal selected from the group consisting of ruthenium (Ru), osmium (Os), iridium (Ir), and Pt.

A method for manufacturing a capacitor according to an embodiment of the present invention will be described.

Initially, a precursor mixture of a desired Bi—Ti—Si—O thin film is prepared, and the desired Bi—Ti—Si—O thin film is formed on the surface of a lower electrode formed of a Pt group element, using ALD, MOCVD, PLD, MBE, etc.

Next, an upper electrode is formed on the Bi—Ti—Si—O thin film.

Next, the resulting structure is annealed at a high temperature. This high-temperature annealing is performed to enhance the crystalline properties of the Bi—Ti—Si—O thin film for improved dielectric properties. The high-temperature annealing may be performed at a temperature of 500–800° C. for 1–30 minutes in a $O_2$ or $O_3$ oxidizing atmosphere or an inert $N_2$ atmosphere, or in a vacuum of 0.01–100 mtorr, and preferably, about 35 mtorr.

The high-temperature annealing is followed by a thermal compensation process. This thermal compensation process is performed in order to compensate for the lack of oxygen at the interface between the dielectric Bi—Ti—Si—O thin film and each of the upper and lower electrodes when the high-temperature annealing is performed under non-oxidative atmosphere such as an inert gas or vaccum atmosphere.

The thermal compensation process is performed at a temperature of 500° C. or less, and preferably 200–450° C. for 10–60 minutes in a vacuum, in air, or in an inert gas atmosphere.

A Bi—Ti—Si—O thin film according to the present invention can be used as a gate dielectric layer of a transistor.

A transistor according to the present invention includes a source electrode, a drain electrode, and a substrate with a conductive region between the source electrode and the drain electrode, a gate dielectric film formed of the Bi—Ti—Si—O of formula (1) above on the conductive region, and a gate electrode formed on the gate dielectric film.

Figure 1A:
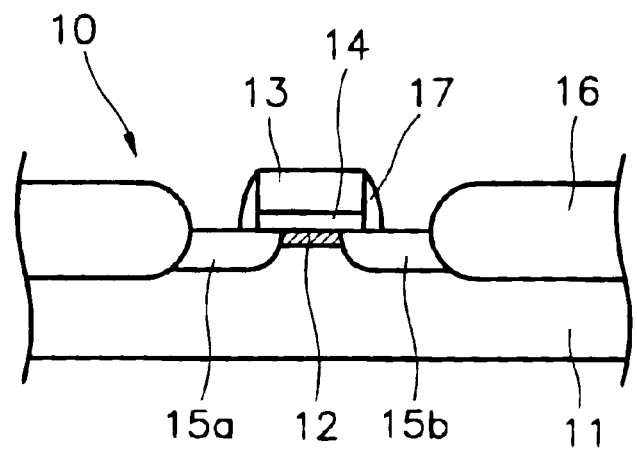
FIG. 1A illustrates a cross-sectional view of a transistor showing the structure of a transistor according to an embodiment of the present invention.

The structure of a transistor according to an embodiment of the present invention is shown in FIG. 1A. Referring to FIG. 1A, a transistor 10 includes a source electrode 15a, a drain electrode 15b, and a gate electrode 13 arranged on a conductive region 12 of a silicon substrate 11 between the source electrode 15a and the drain electrode 15b. A gate dielectric film 14 is formed underneath the gate electrode 13. The gate dielectric film 14 is formed of the Bi—Ti—Si—O thin film of formula (1) above with spacers 17 on both sides to protect the gate electrode 13 and the gate dielectric film 14 formed below the gate electrode 13. In FIG. 1A, reference numeral 16 denotes a non-active region.

A capacitor and a transistor according to the present invention that include the Bi—Ti—Si—O thin film of formula (1) above can be applied to various electronic devices, separately or together. Examples of such electronic devices include dynamic random access memory (DRAM) devices.

Figure 1B:
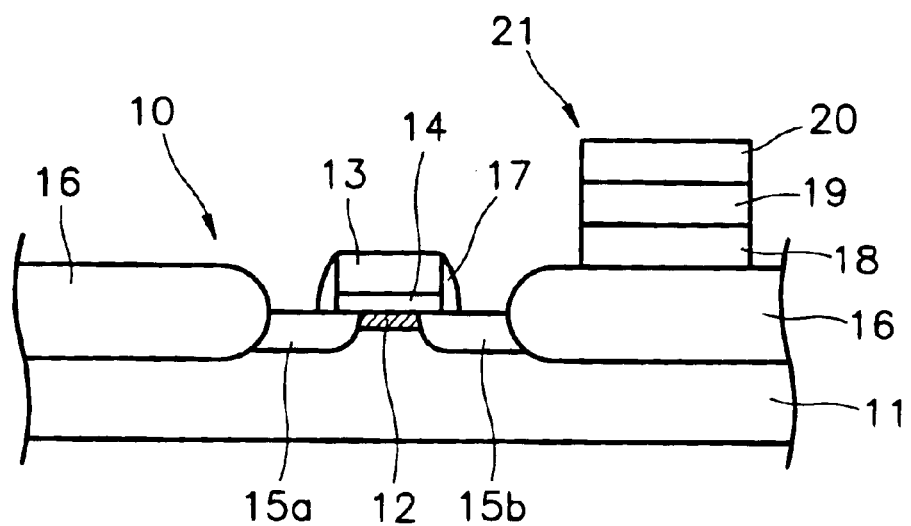
FIGS. 1B and 1C illustrate sectional views of memory devices showing the structure of memory devices having a transistor and a capacitor according to embodiments of the present invention.
Figure 1C:
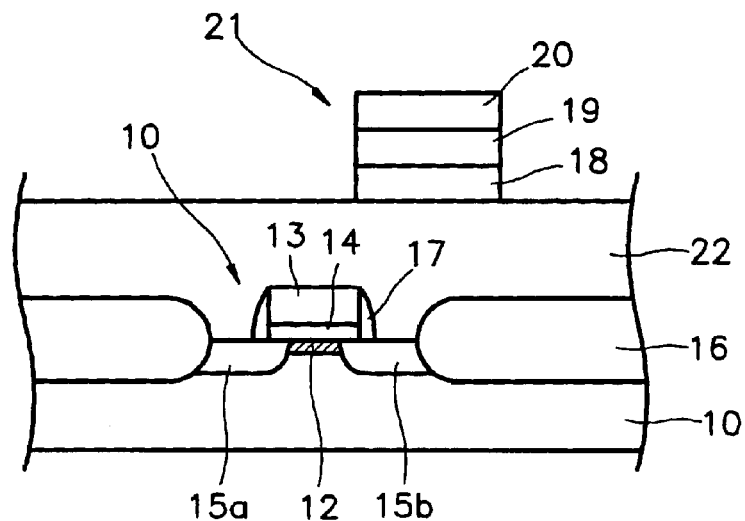

FIGS. 1B and 1C are sectional views illustrating the structure of memory devices using a capacitor C and a transistor Tr according to embodiments of the present invention. In FIGS. 1B and 1C, reference numeral 10 denotes a transistor, reference numeral 11 denotes a silicon substrate, reference numeral 12 denotes a conductive region, reference numeral 13 denotes a gate electrode, reference numeral 14 denotes a gate dielectric film, reference numeral 15a denotes a source electrode, reference numeral 15b denotes a drain electrode, reference numeral 16 denotes a non-active region, reference numeral 17 denotes a spacer, reference numeral 18 denotes a lower electrode, reference numeral 19 denotes a dielectric thin film formed of the Bi—Ti—Si—O of formula (1) above, reference numeral 20 denotes an upper electrode, reference numeral 21 denotes a capacitor, and reference numeral 22 denotes an underlying structure.

The present invention will be described in greater detail with reference to the following examples. The following examples are for illustrative purposes and are not intended to limit the scope of the invention.

EXAMPLE 1

30 ml of a solution of $Bi(MMP)_3$ (0.4 mol/L) in ethylcyclohexane (ECH), 25 ml of a solution of $Ti(MMP)_4$ (0.4 mol/L) in ECH, and 3.6 ml of tetraethyl orthosilicate (TEOS) were mixed to provide a precursor mixture of a Bi—Ti—Si—O thin film with a concentration of 0.06 mol/L for $Bi(MMP)_3$, 0.05 mol/L for $Ti(MMP)_4$, and 0.08 mol/L for TEOS.

This precursor mixture was supplied into a vaporizer at 230° C. by direct liquid injection, evaporated by flash evaporation, and carried into a reactor to form a Bi—Ti—Si—O thin film, through atomic deposition, on a $Ru/SiO_2/Si$ substrate whose temperature was maintained at 400° C.

EXAMPLE 2

25 ml of a solution of $Bi(MMP)_3$ (0.4 mol/L) in ECH, 30 ml of a solution of $Ti(MMP)_4$ (0.4 mol/L) in ECH, and 3.6 ml of TEOS were mixed to provide a precursor mixture of a Bi—Ti—Si—O thin film with a concentration of 0.05 mol/L for $Bi(MMP)_3$, 0.06 mol/L for $Ti(MMP)_4$, and 0.08 mol/L for TEOS.

This precursor mixture was supplied into a vaporizer at 230° C. by direct liquid injection, evaporated by flash evaporation, and carried into a reactor to form a Bi—Ti—Si—O thin film, through atomic deposition, on a $Ru/SiO_2/Si$ substrate whose temperature was maintained at 400° C.

In this embodiment, the Bi—Ti—Si—O thin film was formed in the same manner as in Example 1, except that the concentrations of $Bi(MMP)_3$, $Ti(MMP)_4$, and TEOS in ECH in the precursor mixture were varied to 0.05 mol/L, 0.06 mol/L, and 0.08 mol/L, respectively.

EXAMPLE 3

25 ml of a solution of $Bi(MMP)_3$ (0.4 mol/L) in ECH, 25 ml of a solution of $Ti(MMP)_4$ (0.4 mol/L) in ECH, and 4 ml of TEOS were mixed to provide a precursor mixture of a Bi—Ti—Si—O thin film with a concentration of 0.05 mol/L for $Bi(MMP)_3$, 0.05 mol/L for $Ti(MMP)_4$, and 0.09 mol/L for TEOS.

This precursor mixture was supplied into a vaporizer at 230° C. by direct liquid injection, evaporated by flash evaporation, and carried into a reactor to form a Bi—Ti—Si—O thin film, through atomic deposition, on a $Ru/SiO_2/Si$ substrate whose temperature was maintained at 400° C.

In this embodiment, the Bi—Ti—Si—O thin film was formed in the same manner as in Example 1, except that the concentrations of $Bi(MMP)_3$, $Ti(MMP)_4$, and TEOS in ECH in the precursor mixture were varied to 0.05 mol/L, 0.05 mol/L, and 0.09 mol/L, respectively.

Figure 2:
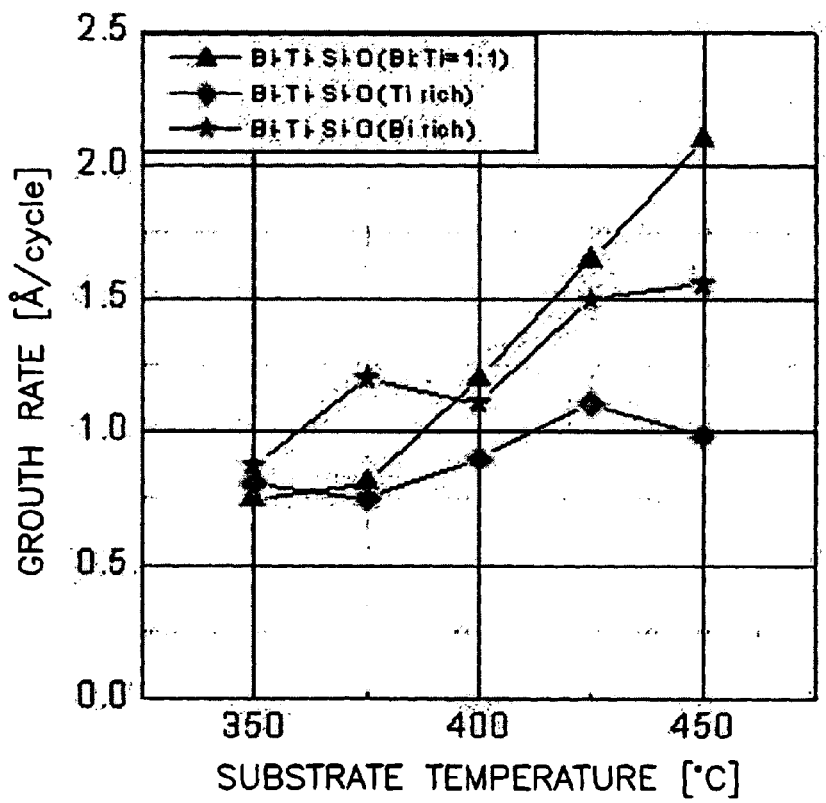
FIG. 2 illustrates a graph of film growth rate versus substrate temperature for bismuth-titanium-silicon-oxide (Bi—Ti—Si—O) thin films formed in Examples 1 through 3 according to the present invention.

The growth rate of a bi—TI—Si—O thin film at various substrate temperatures was measured using the Bi—Ti—Si—O thin films formed in Examples 1 through 3. The results are shown in FIG. 2. In FIG. 2, "Bi—Ti—Si—O (Bi—rich)" is for Example 1, "Bi—Ti—Si—O (Ti rich)" is for Example 2, and "Bi—Ti—Si—O (Bi:Ti=1:1)" is for Example 3. As shown in FIG. 2, when more Bi is used compared to Ti, the growth rate of the Bi—Ti—Si—O thin film becomes higher. A larger amount of Ti leads to a lower growth rate of the Bi—Ti—Si—O thin film. The effect of the substrate's temperature on the growth rate of the Bi—Ti—Si—O thin film is found to be relatively small, indicating that a Bi—Ti—Si—O thin film according to the present invention can be formed at a high temperature when an atomic deposition technique is applied.

EXAMPLE 4

35 ml of a solution of $Bi(MMP)_3$ (0.4 mol/L) in ECH, 25 ml of a solution of $Ti(MMP)_4$ (0.4 mol/L) in ECH, and 3.6 ml of TEOS were mixed to provide a precursor mixture of a Bi—Ti—Si—O thin film with a concentration of 0.07 mol/L for Bi(MMP)$_3$, 0.05 mol/L for Ti(MMP)$_4$, and 0.08 mol/L for TEOS.

This precursor mixture was supplied into a vaporizer at 230° C. by direct liquid injection, evaporated by flash evaporation, and carried into a reactor to form a Bi—Ti—Si—O thin film, through atomic deposition, on a Ru/SiO$_2$/Si substrate whose temperature was maintained at 400° C.

In this embodiment, the Bi—Ti—Si—O thin film was formed in the same manner as in Example 1,except that the concentrations of Bi(MMP)$_3$, Ti(MMP)$_4$, and TEOS in ECH in the precursor mixture were varied to 0.07 mol/L, 0.05 mol/L, and 0.08 mol/L, respectively.

EXAMPLE 5

25 ml of a solution of Bi(MMP)$_3$ (0.4 mol/L) in ECH, 25 ml of a solution of Ti(MMP)$_4$ (0.4 mol/L) in ECH, and 4.4 ml of TEOS were mixed to provide a precursor mixture of a Bi—Ti—Si—O thin film with a concentration of 0.05 mol/L for Bi(MMP)$_3$, 0.05 mol/L for Ti(MMP)$_4$, and 0.1 mol/L for TEOS.

This precursor mixture was supplied into a vaporizer at 230° C. by direct liquid injection, evaporated by flash evaporation, and carried into a reactor to form a Bi—Ti—Si—O thin film, through atomic deposition, on a Ru/SiO$_2$/Si substrate whose temperature was maintained at 400° C.

In this embodiment, the Bi—Ti—Si—O thin film was formed in the same manner as in Example 1, except that the concentrations of Bi(MMP)$_3$, Ti(MMP)$_4$, and TEOS in ECH in the precursor mixture were varied to 0.05 mol/L, 0.05 mol/L, and 0.10 mol/L, respectively.

EXAMPLE 6

35 ml of a solution of Bi(MMP)$_3$ (0.4 mol/L) in ECH, 25 ml of a solution of Ti(MMP)$_4$ (0.4 mol/L) in ECH, and 3.6 ml of TEOS were mixed to provide a precursor mixture of a Bi—Ti—Si—O thin film with a concentration of 0.05 mol/L for Bi(MMP)$_3$, 0.07 mol/L for Ti(MMP)$_4$, and 0.08 mol/L for TEOS.

This precursor mixture was supplied into a vaporizer at 230° C. by direct liquid injection, evaporated by flash evaporation, and carried into a reactor to form a Bi—Ti—Si—O thin film, through atomic deposition, on a Ru/SiO$_2$/Si substrate whose temperature was maintained at 400° C.

In this embodiment, the Bi—Ti—Si—O thin film was formed in the same manner as in Example 1,except that the concentrations of Bi(MMP)$_3$, Ti(MMP)$_4$, and TEOS in ECH in the precursor mixture were varied to 0.05 mol/L, 0.07 mol/L, and 0.08 mol/L, respectively.

Figure 3:
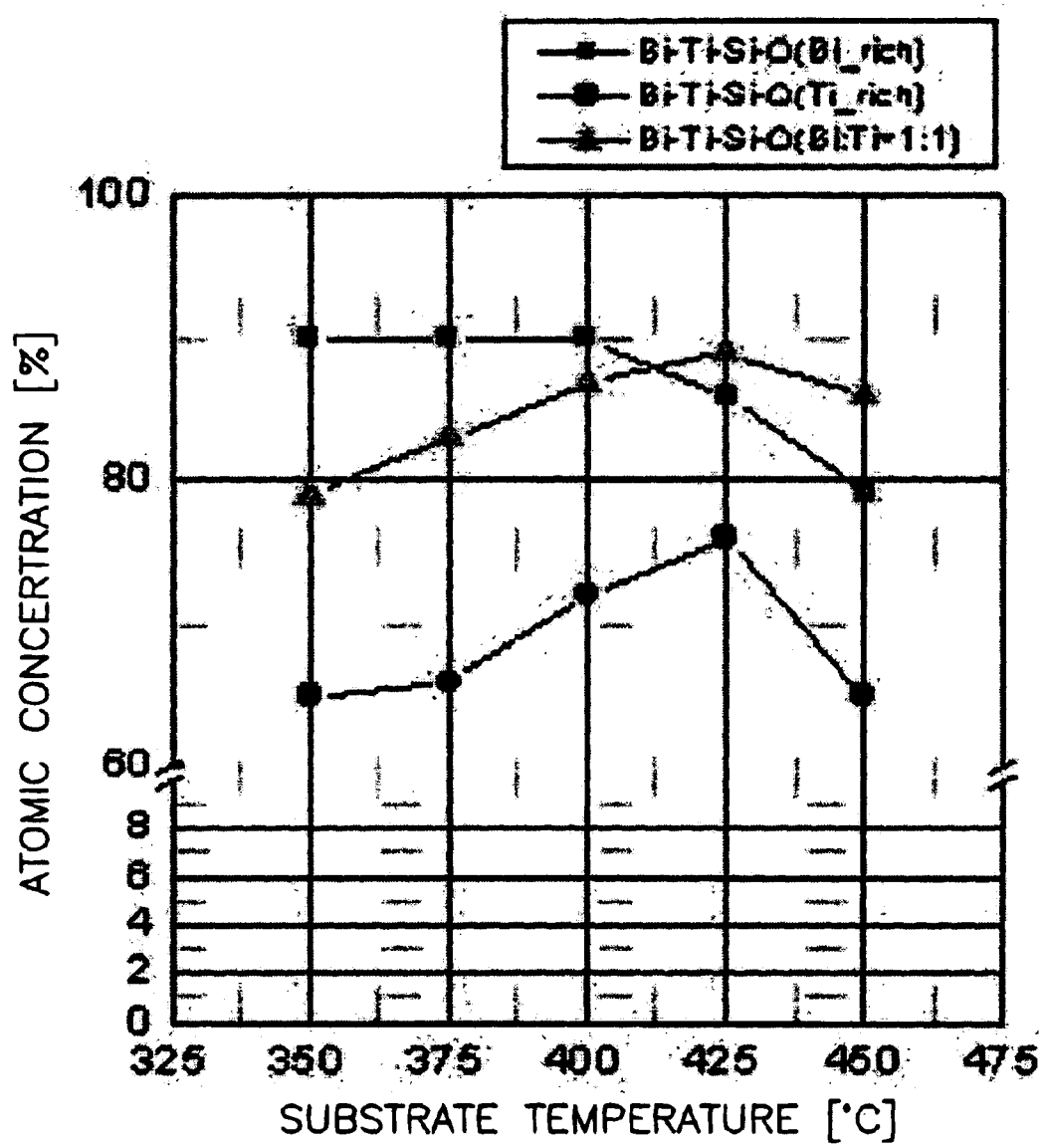
FIG. 3 illustrates a graph of the atomic percentage of Bi in Bi—Ti—Si—O thin films formed in Examples 4 through 6 according to present invention, which is measured using inductively coupled plasma-atomic emission spectroscopy (ICP-AES)

The Bi in the Bi—Ti—Si—O thin films formed in Examples 4 through 6 was quantized using inductively coupled plasma-atomic emission spectroscopy (ICP-AES). The results are shown in FIG. 3. In FIG. 3, "Bi—Ti—Si—O (Bi-rich)" is for Example 4, "Bi—Ti—Si—O (Ti rich)" is for Example 5, and "Bi—Ti—Si—O (Bi:Ti=1:1)" is for Example 6.

As shown in FIG. 3, all of the Bi—Ti—Si—O thin films contain 60% or greater Bi. It is apparent from this result that Bi is incorporated into the Bi—Ti—Si—O thin film faster than Ti. At substrate temperatures of 400° C. or less, no volatile Bi$_2$O$_3$ is generated, so that the amount of Bi in the thin films is preserved.

Figure 4:
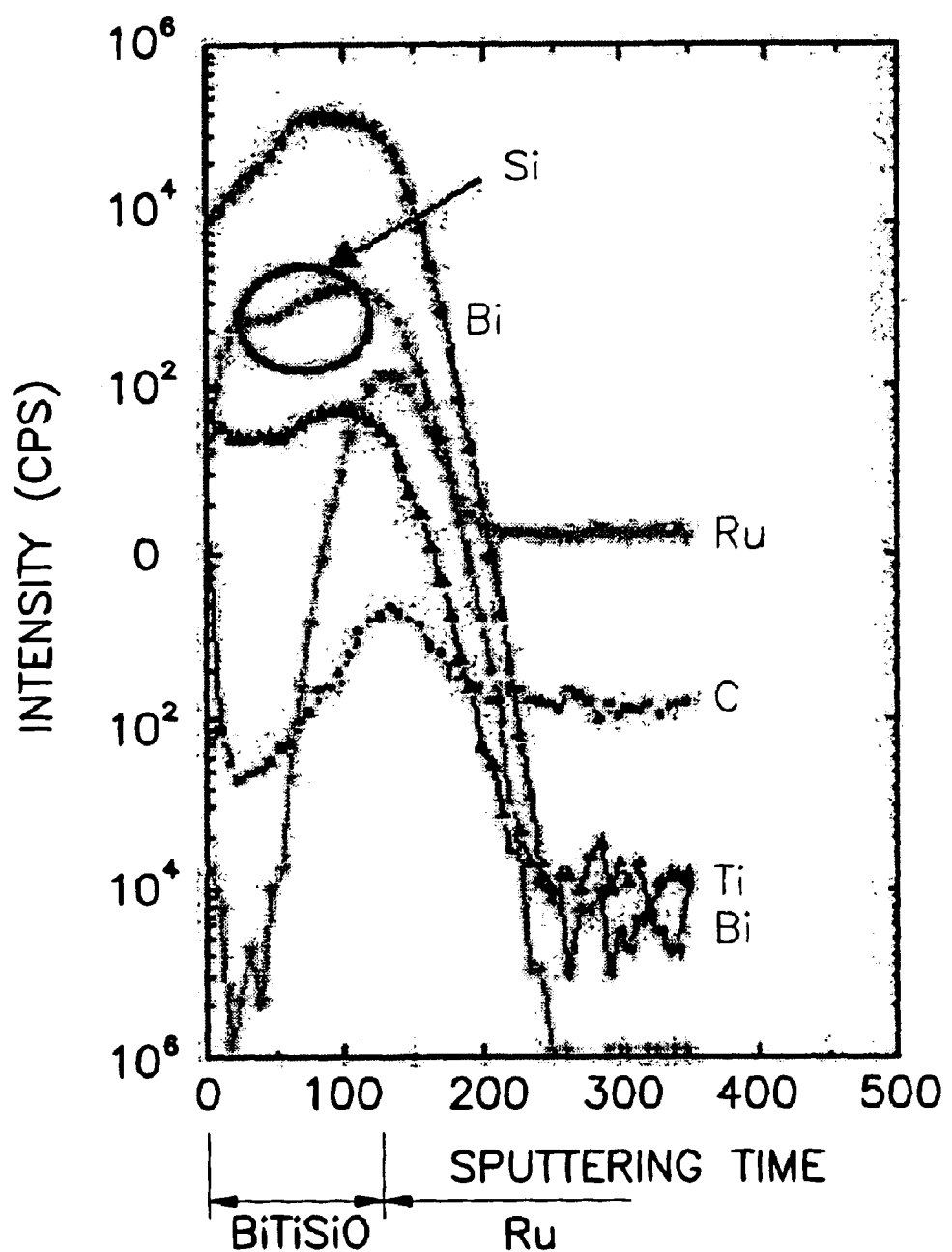
FIG. 4 illustrates a graph showing the result of an analysis using a secondary ion mass spectrometer (SIMS) for the Bi—Ti—Si—O thin film formed in Example 5 according to the present invention.

The compositional distribution in the Bi—Ti—Si—O thin film formed in Example 6, along the thickness direction thereof, was measured using secondary ion mass spectrometer (SIMS). The result is shown in FIG. 4. The result of FIG. 4 confirms that Si is incorporated into the Bi—Ti—Si—O thin film.

EXAMPLE 7

A Bi—Ti—Si—O thin film was formed in the same manner as in Example 1, except that a Pt(1000 Å)/Ti(100 Å)/SiO$_2$(2000 Å)/Si substrate was used, a precursor mixture with a concentration of 0.04 mol/L for Bi(MMP)$_3$, 0.08 mol/L for Ti(MMP)$_4$, and 0.08 mol/L for TEOS in ECH was prepared, the vaporizer's temperature was set to 230° C., the substrate's temperature was set to about 400° C. for deposition, and deposition was followed by annealing at 600° C. for 30 minutes in an O$_2$ atmosphere.

Using Bi—Ti—Si—O thin film formed in this embodiment, changes in the crystalline structure of the Bi—Ti—Si—O thin film (having a thickness of 300 Å) before and after annealing at 600° C. were observed using X-ray diffraction (XRD). The results are shown in FIG. 5. In FIG. 5, (a) and (b) are for the Bi—Ti—Si—O thin film before and after annealing, respectively.

Referring FIG. 5, a crystalline peak, indicated by ★, appears at 2 θ near 27 degrees after deposition and before annealing. After annealing, more crystalline peaks appear, and the intensity of the peak observed near 27 degrees before annealing becomes smaller whereas the intensity of a peak near 30 degrees remarkably increases. From these results, it is apparent that the crystalline orientation changes through the annealing.

Figure 6A:
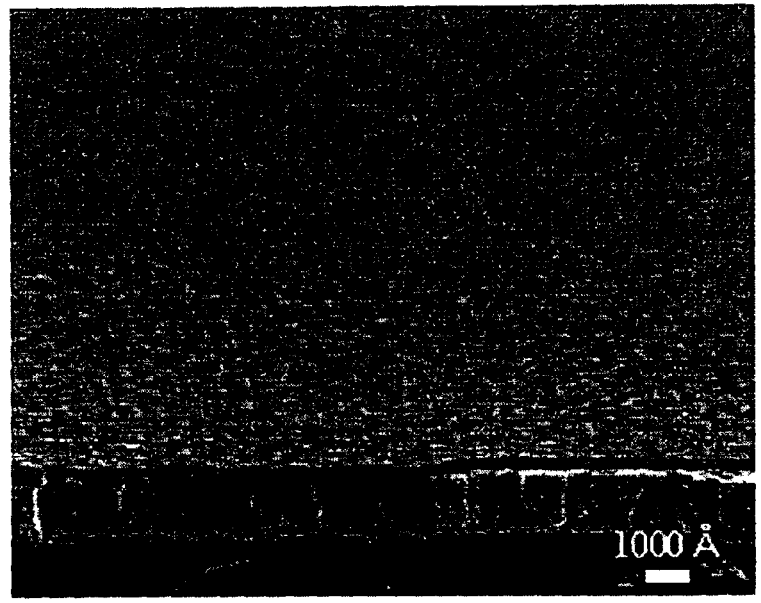
FIGS. 6A and 6B are scanning electron microscopic (SEM) photographs showing the topology of the surface of the Bi—Ti—Si—O thin film formed in Example 7 according to the present invention before annealing.
Figure 6B:

The topology of the surface of the Bi—Ti—Si—O thin film formed in Example 7 before annealing was observed using a scanning electron microscope (SEM). The results are shown in FIGS. 6A and 6B. FIG. 6A is a SEM photograph of the surface of the thin film taken at an angle, and FIG. 6B is a SEM photograph of the surface of the same thin film.

As shown in FIGS. 6A and 6B, the Bi—Ti—Si—O thin film is deposited fairly evenly. As a result of measuring surface roughness using an atomic force microscope (AFM), the surface roughness measured as a root mean square (RMS) has a small value of about 6.6 Å.

The electrical properties of the Bi—Ti—Si—O thin film formed in Example 7 were measured. The results are shown in FIGS. 7A and 7B.

Figure 7A:
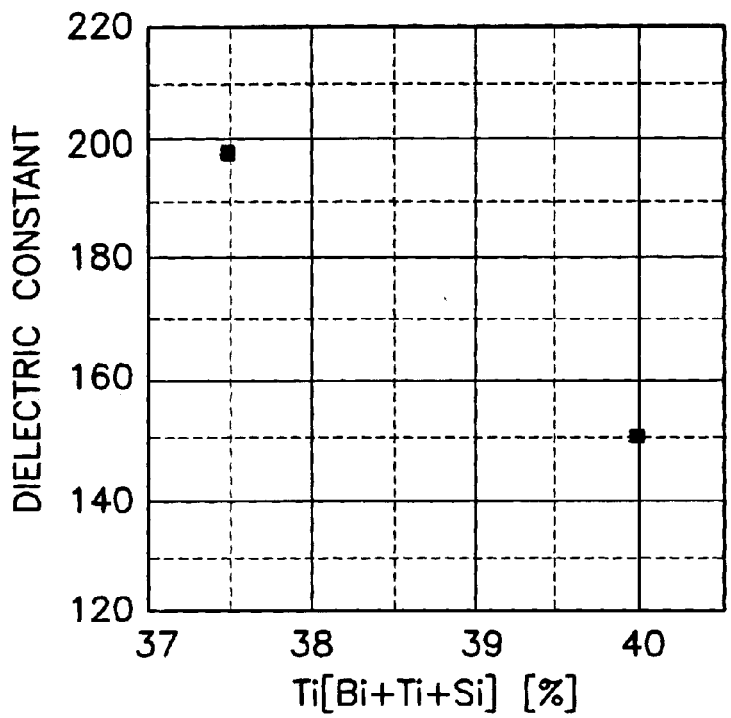
FIGS. 7A and 7B illustrate graphs showing the electrical properties of the capacitor manufactured in Example 7 according to the present invention.

FIG. 7A shows the change in dielectric constant when the composition of the thin film is varied using different compositions of precursors, which was measured after annealing at 700° C. for 5 minutes. FIG. 7B shows the change in dielectric constant before and after annealing at 700° C. for 5 minutes.

Referring to FIG. 7A, the dielectric constant of the Bi—Ti—Si—O thin film changes greatly depending on the cationic composition in the film.

Figure 7B:
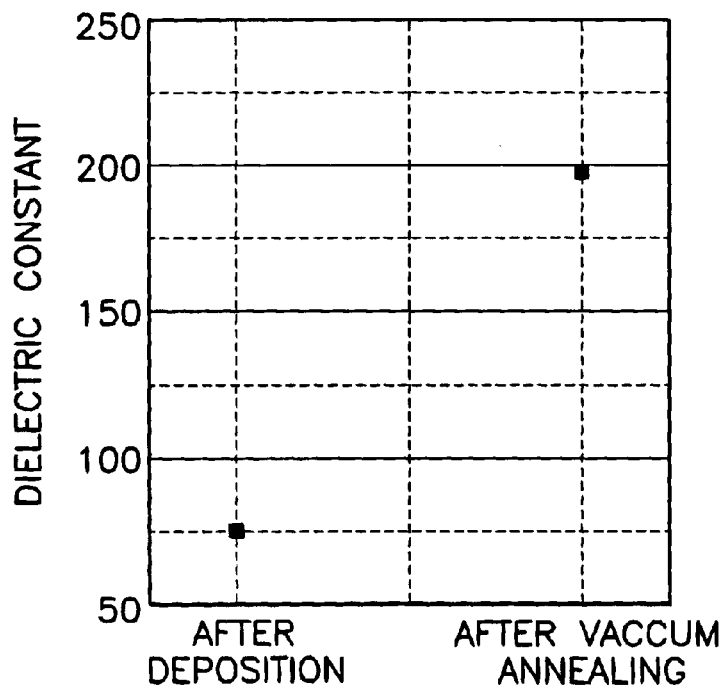

Referring to FIG. 7B, the dielectric constant was 73 before annealing and 193 after annealing, wherein the loss factor was less than 3%. A loss factor is a measure of how much dielectric properties, such as capacitance, are being lost by an alternating current (AC) signal applied during measurement.

EXAMPLE 8

Manufacture of a Capacitor 22.5 ml of a solution of Bi(MMP)$_3$ (0.4 mol/L) in ECH, 37.5 ml of a solution of Ti(MMP)$_4$ (0.4 mol/L) in ECH, and 3.6 ml of TEOS were mixed to provide a precursor mixture of a Bi—Ti—Si—O thin film with a concentration of 0.045 mol/L for Bi(MMP)$_3$, 0.075 mol/L for Ti(MMP)$_4$, and 0.08 mol/L for TEOS.

This precursor mixture was supplied into a vaporizer at 230° C. by direct liquid injection, evaporated by flash evaporation, and carried into a reactor to form a Bi—Ti—Si—O thin film, through atomic deposition, on a Ru/SiO$_2$/Si substrate with a Ru electrode while the temperature of the substrate was maintained at 400° C., followed by annealing at 700° C. for 10 minutes to form a complete Bi—Ti—Si—O thin film having a thickness of 350 Å. Next, another Ru electrode is formed on the Bi—Ti—Si—O thin film to complete the formation of a capacitor.

Figure 8:
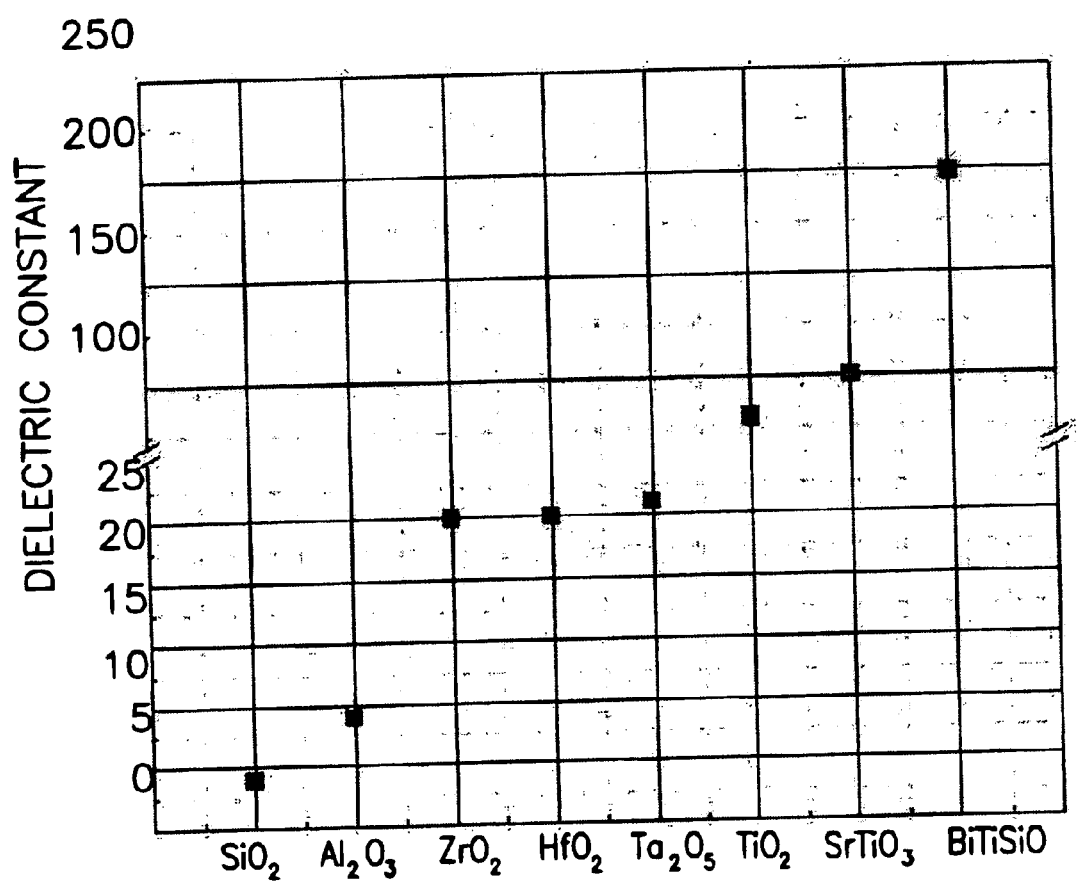
FIG. 8 illustrates a graph showing the dielectric constant of a Bi—Ti—Si—O thin film formed in Example 8 according to the present invention.

The dielectric constant was calculated from the measured capacitance of the capacitor. The result is shown in FIG. 8. The dielectric constants of other materials are shown in FIG. 8 for comparison. Referring to FIG. 8, the Bi—Ti—Si—O thin film formed in Example 8 has a dielectric constant of 198, which is much greater than other materials, for example, SrTiO$_3$ having a dielectric constant of 100.

EXAMPLE 9

Manufacture of a Capacitor 22.5 ml of a solution of Bi(MMP)$_3$ (0.4 mol/L) in ECH, 37.5 ml of a solution of Ti(MMP)$_4$ (0.4 mol/L) in ECH, and 3.6 ml of TEOS were mixed to provide a precursor mixture of a Bi—Ti—Si—O thin film with a concentration of 0.045 mol/L for Bi(MMP)$_3$, 0.075 mol/L for Ti(MMP)$_4$, and 0.08 mol/L for TEOS.

This precursor mixture was supplied into a vaporizer at 230° C. by direct liquid injection, evaporated by flash evaporation, and carried into a reactor to form a Bi—ti—Si—O thin film, through atomic deposition, on a Ru/SiO$_2$/Si substrate at 400° C., followed by annealing at 600° C. for 10 minutes to form a complete Bi—Ti—Si—O thin film having a thickness of 350 Å.

Next, a Ru is formed on the Bi—Ti—Si—O thin film, followed by annealing at 600° C. for 10 minutes in a vacuum of 35 mtorr so as to prevent oxidation of the Ru. Next, in order to reduce a leakage current, annealing is performed at 400° C. for 30 minutes in air to complete the formation of a capacitor.

Figure 9A:
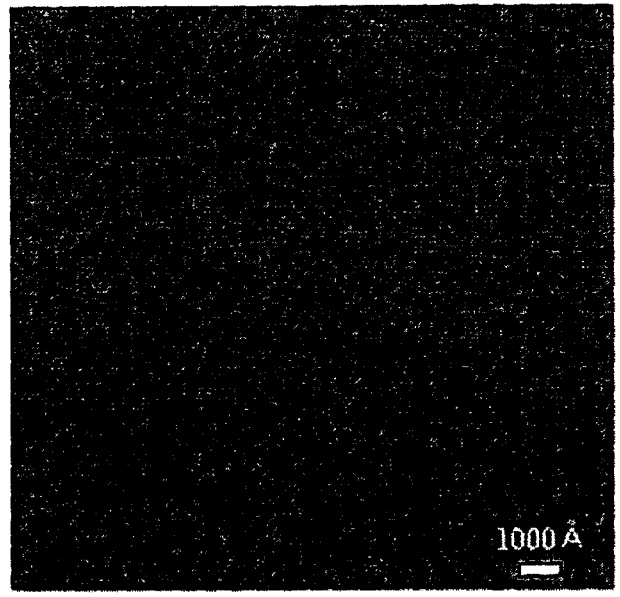
FIGS. 9A and 9B are SEM photographs showing the topology of the surface of a Bi—Ti—Si—O thin film formed in Example 9 according to the present invention, before and after annealing, respectively.
Figure 9B:
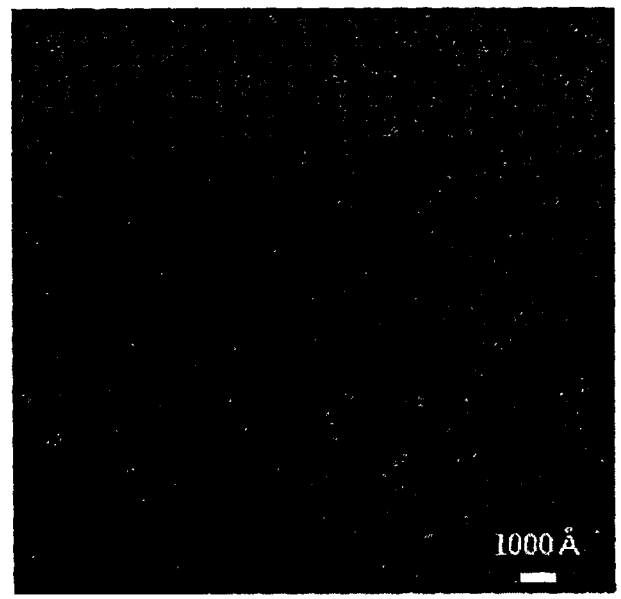

The topology of the surface of the Bi—Ti—Si—O thin film formed in Example 9 before and after annealing was observed using AFM. The results are shown in FIGS. 9A and 9B. FIG. 9A shows the topology of the surface of the Bi—Ti—Si—O thin film after being deposited at 400° C., and FIG. 9B shows the topology of the surface of the Bi—Ti—Si—O thin film after the annealing at 600° C. for 10 minutes in vacuum and at 400° C. for 30 minutes in air.

As shown in FIG. 9A, the thin film immediately after deposition has a very even surface with a small surface roughness of about 4 Å, which was measured as a RMS. As shown in FIG. 9B, even after the annealing, the surface roughness of the thin film is small at about 12 Å.

The electrical properties of the capacitor manufactured in Example 9 were measured. The results are shown in FIGS. 10A and 10B.

Figure 10A:
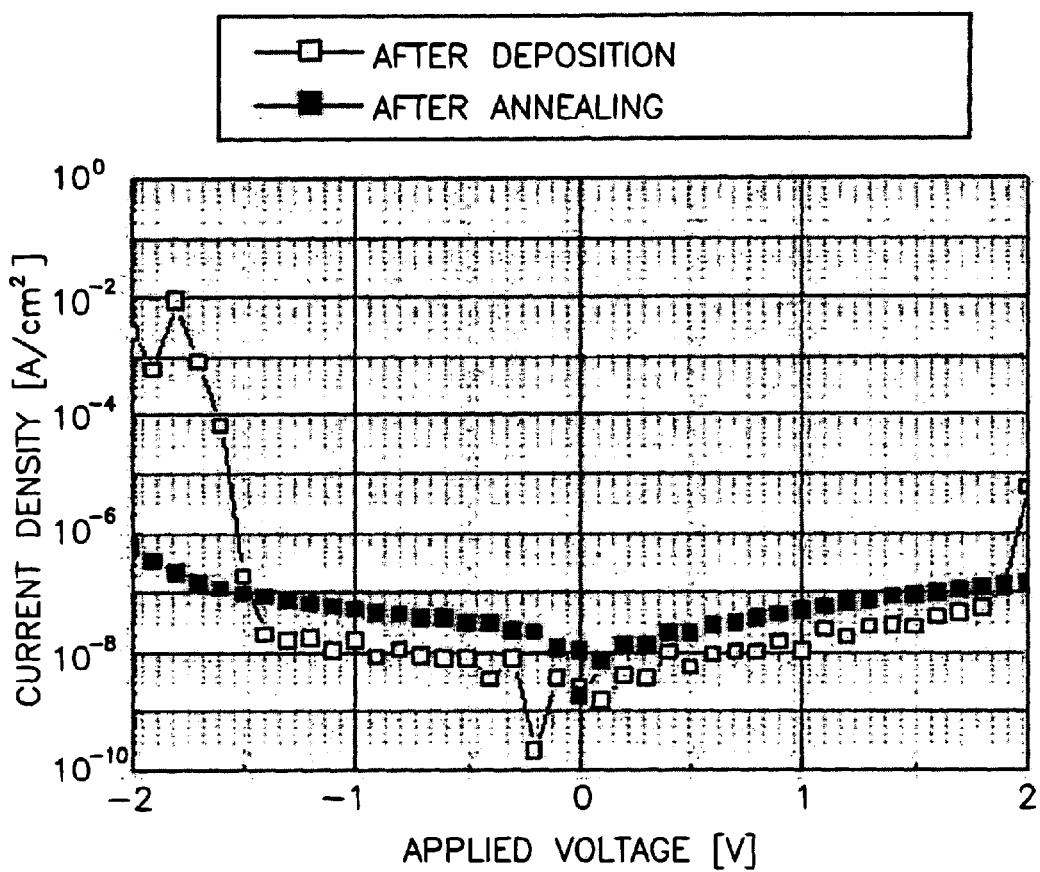
FIGS. 10A and 10B illustrate graphs showing the electrical properties of a capacitor manufactured in Example 9 according to the present invention.
Figure 10B:
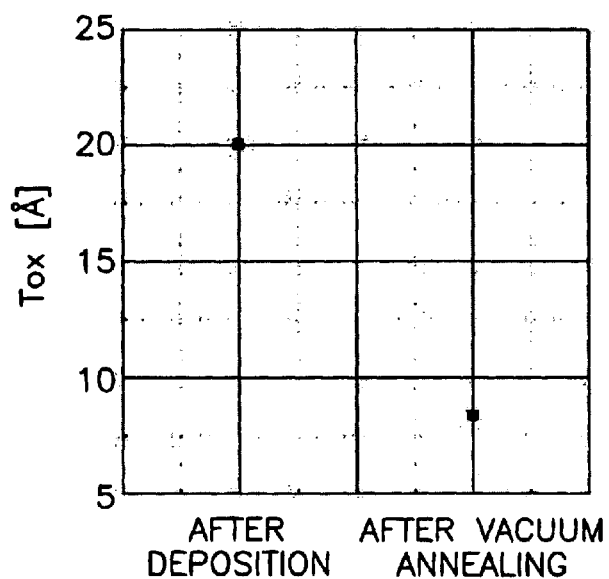

FIG. 10A shows a curve of current density versus voltage. As is apparent from FIG. 10A, the capacitor has a current density of 10$^{-7}$ A/cm$^2$ at a voltage of ±1V that is a required level for DRAMs. FIG. 10B shows the change in oxide thickness (T$_{ox}$) after deposition and after annealing. As shown in FIG. 10B, the oxide thickness T$_{ox}$ after deposition is 20. The oxide thickness T$_{ox}$ after annealing is 7Å, which is required for 16G or greater DRAMs. Here, 't$_{ox}$' is a thickness of SiO$_2$, and may be expressed by the following general equation:

$t_{ox}$={(a dielectric constant of SiO2)(an area of an upper electrode in a capacitor)}/{a capacitance of the capacitor}.

A smaller value of t$_{ox}$ indicates a higher quality dielectric layer.

The dielectric constant of the Bi—Ti—Si—O thin film formed in Example 8 was measured. As a result, the dielectric constant of the Bi—Ti—Si—O thin film is 96 after deposition and 230 after annealing.

A bismuth titanium silicon oxide according to the present invention has good dielectric properties and is thermally and chemically stable. A thin film formed of this bismuth titanium silicon oxide can be effectively used for a dielectric film of a capacitor or for a gate dielectric film of a transistor in a semiconductor device. Various electronic devices having good electrical properties can be manufactured using a capacitor and/or a transistor according to the present invention having the above-described bismuth-titanium-silicon oxide film.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A bismuth titanium silicon oxide of formula (1) below having a pyrochlore phase:

$$Bi_2(Ti_{2-x}Si_x)O_{7-y} \qquad (1)$$

where x is a figure ranging from 0.8 to 1.3, and y is a figure ranging from −1 to 1.

2. A bismuth-titanium-silicon oxide thin film of formula (1) below having a pyrochlore phase:

$$Bi_2(Ti_{2-x}Si_x)O_{7-y} \qquad (1)$$

where x is a figure ranging from 0.8 to 1.3, and y is a figure ranging from −1 to 1.

3. A capacitor for a semiconductor device, the capacitor comprising:
   a lower electrode;
   a dielectric film formed on the lower electrode of a bismuth titanium silicon oxide of formula (1) below having a pyrochlore phase:

$$Bi_2(Ti_{2-x}Si_x)O_{7-y} \qquad (1)$$

where x is a figure ranging from 0.8 to 1.3, and y is a figure ranging from −1 to 1; and
   an upper electrode formed on the dielectric film.

4. A transistor for a semiconductor device, the transistor comprising:
   a source electrode;
   a drain electrode;
   a substrate having a conductive region between the source electrode and the drain electrode;
   a gate dielectric film formed on the conductive region of a bismuth titanium silicon oxide of formula (1) below having a pyrochlore phase:

$$Bi_2(Ti_{2-x}Si_x)O_{7-y} \qquad (1)$$

where x is a figure ranging from 0.8 to 1.3, and y is a figure ranging from −1 to 1; and
   a gate electrode formed on the gate dielectric film.

5. An electronic device comprising a capacitor and/or a transistor, wherein the capacitor includes a lower electrode, a dielectric film formed on the lower electrode of a bismuth titanium silicon oxide of formula (1) below having a pyrochlore phase, and an upper electrode formed on the dielectric film; and the transistor includes a source electrode, a drain electrode, a substrate having a conductive region between the source electrode and the drain electrode, a gate dielectric film formed on the conductive region of a bismuth titanium silicon oxide of formula (1) below having a pyrochlore phase, and a gate electrode formed on the gate dielectric film:

$$Bi_2(Ti_{2-x}Si_x)O_{7-y} \quad (1)$$

where x is a figure ranging from 0.8 to 1.3, and y is a figure ranging from −1 to 1.

6. The electronic device as claimed in claim 5, wherein the electronic device is a dynamic random access memory.

* * * * *